United States Patent
Albayrak et al.

(10) Patent No.: US 6,985,366 B2
(45) Date of Patent: Jan. 10, 2006

(54) EMC SHIELD AND HOUSING FOR ELECTRONIC COMPONENTS

(75) Inventors: Goekhan Albayrak, Villingen-Schwenningen (DE); Werner Miethig, Brigachtal (DE); Patrick Ulmer, Villingen-Schwenningen (DE)

(73) Assignee: Siemens Aktiengesellschaft, München ( * ) Notice: Subject to any disclaimer, the term of this patent is extended or adjusted under 35 U.S.C. 154(b) by 280 days.

(21) Appl. No.: 10/443,748

(22) Filed: May 23, 2003

(65) Prior Publication Data

US 2003/0227760 A1    Dec. 11, 2003

(30) Foreign Application Priority Data

May 24, 2002    (DE) ................ 10223170

(51) Int. Cl.
H05K 7/14    (2006.01)
H05K 7/18    (2006.01)

(52) U.S. Cl. ............... 361/800; 361/816; 361/818
(58) Field of Classification Search ........... 361/800, 361/816, 818
See application file for complete search history.

(56) References Cited

U.S. PATENT DOCUMENTS

| | | | | |
|---|---|---|---|---|
| 4,754,101 A | * | 6/1988 | Stickney et al. | 174/35 R |
| 5,748,449 A | * | 5/1998 | Tahmassebpur | 361/753 |
| 5,907,478 A | * | 5/1999 | Watanabe | 361/807 |
| 6,137,692 A | * | 10/2000 | Venant | 361/800 |
| 6,469,906 B1 | * | 10/2002 | Baltz et al. | 361/760 |
| 6,490,173 B2 | * | 12/2002 | Perkins et al. | 361/816 |
| 6,649,827 B2 | * | 11/2003 | West et al. | 174/35 R |
| 2003/0218873 A1 | * | 11/2003 | Eromaki et al. | 361/816 |
| 2004/0062020 A1 | * | 4/2004 | Leung et al. | 361/816 |

FOREIGN PATENT DOCUMENTS

| | | |
|---|---|---|
| DE | 35 20 531 A1 | 12/1986 |
| DE | 3520531 A * | 12/1986 |
| DE | 41 37 112 A1 | 5/1993 |
| DE | 43 17 469 A1 | 12/1994 |
| DE | 4317469 A1 * | 12/1994 |
| DE | 29713412 U1 * | 9/1997 |
| DE | 297 13 412 U1 | 11/1997 |
| DE | 198 40 234 C1 | 9/2000 |
| DE | 199 56 184 A1 | 6/2001 |

OTHER PUBLICATIONS

Derwent Abstract, DE29713412, Sep. 25, 1997; Siemens AG, D-80333 München.
Derwent Abstract, DE3520531, Dec. 11, 1986; Hagenuk GmbH, D-2300 Kiel.
Derwent Abstract, DE19840234, Sep. 7, 2000; Siemens AG, D-80333 München.
Derwent Abstract, DE4317469, Dec. 1, 1994; Robert Bosch GmbH, D-70469 Stuttgart.

(Continued)

Primary Examiner—Kamand Cuneo
Assistant Examiner—Yuriy Semenenko
(74) Attorney, Agent, or Firm—Siemens AG; Jacob Eisenberg

(57) ABSTRACT

An EMC shield is provided for electronic components on a printed circuit board, which has a housing which surrounds the electronic components at least on the sides not facing the printed circuit board and shields them against electromagnetic radiation, with the housing having a number of electrically conductive spring contacts which make electrically conductive contact with the printed circuit board, and the housing being pressed against the printed circuit board by means of at least one pressure contact-making device.

23 Claims, 1 Drawing Sheet

OTHER PUBLICATIONS

Derwent Abstract, DE19956184, Jun. 21, 2001; IAD Gesellschaft für Informatik, D-90613 Grosshabersdorf.

Derwent Abstract, DE4137112, May 13,1993; Bayerische Motoren Werke AG, D-8000 München.

* cited by examiner

EMC SHIELD AND HOUSING FOR ELECTRONIC COMPONENTS

CROSS REFERENCE TO RELATED APPLICATIONS

The present application claims priority to German patent application number 10223170.2, filed May 24, 2002 which is herein incorporated by reference.

BACKGROUND OF THE INVENTION

The present invention relates to the field of radiation protection for printed circuit board components and more particularly to an electromagnetic compatability (EMC) shield and housing for such components. The instant shield and housing provide for the possibility for many different component to operate within a substantially electromagnetic environment without degradation in individual performance and the like. Such degradation would otherwise have resulted from electromagnetic interference.

Shielding against electromagnetic radiation is becoming increasingly relevant for electronic apparatus as their sensitivity is becoming ever greater, their performance is increasing, and modern electronic components comprise ever higher clock rates. The EMC as defined in various Standards and works both to protect the electronic components against external electromagnetic radiation and reduce external effects of electromagnetic radiation produced by the shielded components. Exemplary fields of application in which EMC shields are used for electronic components include, electronic controllers for motor vehicle technology and communication terminals which operate in a radio-frequency band, e.g. mobile telephones.

A known example of forming an EMC shield for electronic components on a printed circuit board is to arrange the entire printed circuit board, together with the electronic components, within a housing which provides shielding against electromagnetic radiation. A shielding housing of this type is set out in German reference DE-A1-199 56 184. A disadvantage to this approach is that the provision of connections which have to be passed out of the shielding housing from the printed circuit board in an EMC-compliant manner requires that there be a lack of shielding between individual electronic components. In addition, shielding housing is rather large, heavy, and cumbersome.

In order to avoid these disadvantages, use is made of local EMC shields which are provided immediately around particular electronic components. Such shields are set out in German reference DE-A1-41 37 112. Local EMC shields four side walls and a cover. Side walls of the local shields are soldered to the printed circuit board. To do this, a solder deposit can be provided either on the EMC shield, as is described in German reference DE-C1-198 40 234, and/or on the printed circuit board. Alternatively, the side walls of the EMC shield may also have solder pins, which are passed trough appropriate holes in the printed circuit board and soldered on the boards rear face. These solutions have the disadvantages of the large number of solder points that are required and of the expensive and complex soldering facilities which are requited to solder them. In addition, in the last-mentioned case with plated-through holes, a restriction to the printed circuit board layout is present.

SUMMARY OF THE INVENTION

The present invention is directed to providing an EMC shield and an EMC housing for electronic components on a printed circuit board, which can be easily installed with relatively low costs while retaining its EMC characteristics.

According to one embodiment of the present invention, an EMC shield for electronic components on a printed circuit board comprises a housing which surrounds electronic components on at least the components sides not facing the printed circuit board. The instant shield shields the components against electromagnetic radiation. The shield housing comprises a large number of electrically conductive spring contacts which make electrically conductive contact with the printed circuit board. The housing is further pressed against the printed circuit board by means of at least one pressure contact-making device such as a screw connection device.

The spring contacts on the housing are used to make electrical contact with the printed circuit board. The pressure contact-making device ensures the necessary contact force between the housing and the printed circuit board that is required to make a reliable electrical contact. An advantage of the present invention is that it avoids the above discussed complex soldering process, and the expensive and complex soldering facilities required for assembly. Instead, only a small number of pressure contact-making connections are needed. In addition, these connections may also advantageously be used for attachment of other components.

In another preferred embodiment of the invention, the housing has at least one lug with a recess, in particular a hole for a screw to pass therethrough.

In order to improve the electrical contact between the housing and the printed circuit board, the printed circuit board may also have a solder deposit on its surface facing the housing.

The printed circuit board preferably has at least one recess for accommodating at least one shield housing projection, the projection being intended to engage the recess. Accordingly, it is possible to more easily and accurately position the shield housing on the printed circuit board.

In order to form an EMC shield for all sides of an electronic components, the layout of the printed circuit board may further comprise a surface or surface pattern which provides shielding against electromagnetic radiation for a component placed above or below the surface or surface portion. The housing may be a metal housing or a metalized plastic housing.

In another embodiment of the present invention, the present invention comprises an EMC housing for electromagnetic shielding of electronic components on a printed circuit board having at least two side walls and a cover. The housing further comprises a number of electrically conductive spring contacts and at least one apparatus for holding a pressure contact-making device. The at least one apparatus may comprise a screw connection provided on the side walls of the housing. The EMC housing may flier be used to form the above described inventive EMC shield. The at least one apparatus for holding a pressure contact-making device is formed by a lug with a recess, in particular a hole for a screw to pass through. The housing has at least one projection for engaging in an associated recess in a printed circuit board. This is used to position the housing on the printed circuit board more easily and more accurately. The housing may comprise a metal housing or a metalized plastic housing.

The invention further comprises a shield for electronic components on a printed circuit board, comprising a housing for shielding said component, said housing comprising: at least one side wall surrounding said component, a plurality of spring contacts for engaging said board, and contact means for afixing said housing to said board.

The invention still further comprises A housing for electromagnetic shielding of an electronic component afixed on a printed circuit board, comprising: at least two side walls joined to form a perimeter around said component, a cover attached to said at least two side walls and covering said component, a plurality of conductive spring contacts, and a holding element positioned on said side walls, and pressure contact means accomodated within said holding element, said contact means facilitating affixing of said housing to said board.

BRIEF DESCRIPTION OF THE SEVERAL VIEWS OF THE DRAWINGS

The novel features believed characteristic of the invention are set out in the claims below. The invention itself, however, as well as other features and advantages thereof, are best understood by reference to the detailed description, which follows, when read in conjunction with the accompanying drawing, wherein:

DETAILED DESCRIPTION OF THE INVENTION

Figure 1:
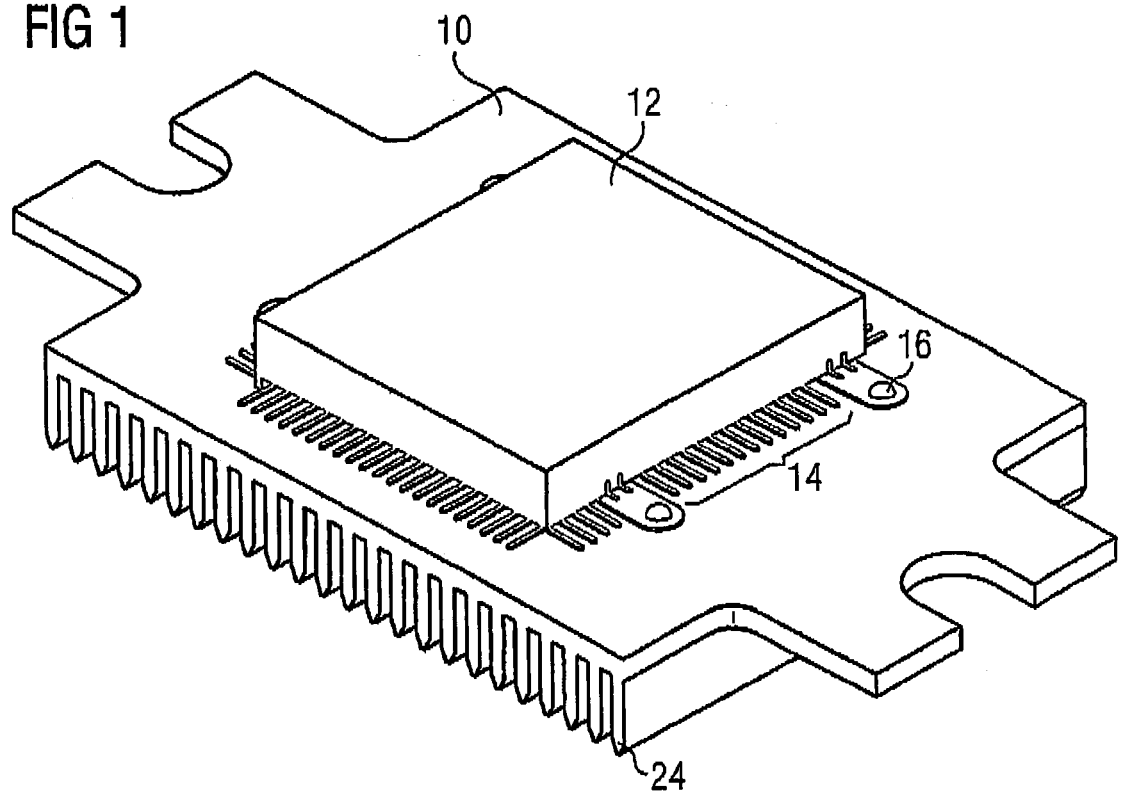
FIG. 1 depicts a schematic perspective illustration of an EMC housing mounted on a printed circuit board and forming an EMC shield.

As may be seen from FIG. 1, the instant EMC shield shields components mounted on printed circuit board 10. The expression shielding will be used to mean not only the protection of the electronic components against external electromagnetic radiation but also the reduction of electromagnetic radiation produced by electronic components towards to components external to the shield.

The EMC shield comprises an EMC housing 12 having numerous side walls 12a and a cover 12b. In the depicted embodiment, cover 12b is rectangular therefore leading to four side walls 12a. Other cover configurations are possible leading to a different number of side walls. The present invention is not restricted by housing shape. Depending on the number, size and arrangement of the electronic components to be shielded on the printed circuit board 10, the housing 12 may also have only three or less or four or more side walls 12a and widely differing cover shapes 12b. The EMC shield housing 12 is preferably composed of metal or metalized plastic.

Since the depicted housing 12, sits atop board 10, in order to provide shielding below the shielded component (not shown), it is advantageous for a shielding surface or surface portion to additionally be provided within the layout of the printed circuit board 10 which, in cooperation with the housing 12, then substantially surrounds the shielded electronic component(s).

On their sides facing the printed circuit board 10, side walls 12a each have two or more spring contacts 14, which project outward essentially at right angles to the side walls 12a. When the EMC housing 12 is installed spring contacts 14 make contact with printed circuit board 10. Furthermore, in order to improve electrical contact, a solder deposit (not illustrated) may be provided on the surface of the printed circuit board 10.

The number of spring contacts 14 and hence the distance between the individual spring contacts 14 may be chosen as a function of the frequency range for which the EMC housing 12 is intended to provide shielding. In one preferred embodiment, the spring contacts 14 have a width of about 1 mm and are separated from one another by about 2 to 3 mm. This makes for a grid size of about 3 to 4 mm. The height of the housing 12 depends essentially on the electronic component(s) to be shielded, and may be from a few millimeters up to several centimeters.

In order to ensure good electrical contact between spring contacts 14 and printed circuit board 10, housing 12 must be pressed against the printed circuit board. The contact pressure must be sufficient so as to ensure that the contact resistance between the spring contacts and the printed circuit board is as low as possible. In an embodiment of the present invention, the contact pressure is facilitated by means of at least one screw cooperating with an appropriately threaded mate within board 10 (not shown). As depicted in the figures, four screws 16 are shown screwed into the printed circuit board. The screws 16 are passed through holes 20 in lugs 18. Lugs 18 are depicted projecting outward along a bottom of side walls 12a.

The housing 12, and hence the spring contacts 14, are pressed against the printed circuit board 10, or against the solder deposit on the printed circuit board 10, by tightening screws 16 within the appropriately threaded mates. Hence, complex afixing methods and processes, such as soldering, are dispensed with. In order to ensure a uniform contact pressure, it is advantageous to provide a screw connection 16 at at least every available corner of the housing 12 or appropriate equivelant thereof depending upon the shape of the housing.

By way of variation, such screw connections 16 may further be used to affix other components and the lie to circuit board 10. By way of example, in FIG. 1, a heat sink 24 is attached to the rear face of the printed circuit board 10. The attachment is effected by cooperation between the heat sink and screw connection 16. Alternatively or in addition to the screw connections provided in the exemplary embodiment other pressure contact means may be provided, for example clips or rivets.

Figure 2:
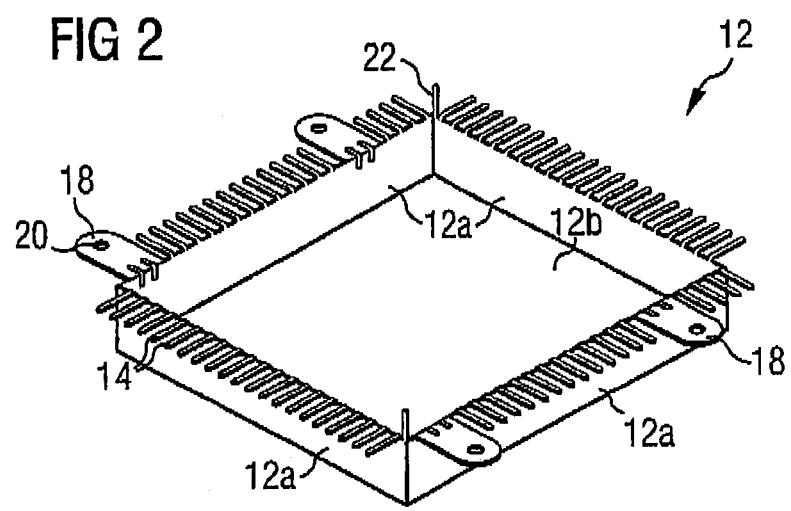
FIG. 2 depicts a schematic perspective illustration of the EMC housing from FIG. 1 from below with the printed circuit board omitted.

In order to simplify the installation of the EMC housing 12 and to allow the housing 12 to be positioned exactly on the printed circuit board 10, two or more projections 22 may be provided on lower edges of the housing side walls 12a. The projections face printed circuit board 10 and can be made to engage corresponding recesses within the printed circuit board 10. A total of two projections 22 are provided at opposite corners of the housing 12 in the exemplary embodiment shown in FIG. 2. Of course another number of projections may be provided at different locations provided appropriate functionality is preserved, namely, guideance of housing placement on board.

While, in the case of the exemplary embodiment which is described above and is illustrated in the figures, the cover 12b of the housing 12 is formed integrally with the side walls 12a of the housing 12, the housing may, of course, also be formed from a side fame 12a and a separately manufactured cover 12b, which can be connected tightly to the side frame 12a.

The EMC shield according to the present invention means, in particular, that there is no need for a complex and costly soldering process for installing the EMC housing on the printed circuit board. Furthermore, the layout of the printed circuit board is not restricted, since the housing does not make contact by means of solder pins through the printed circuit board.

The invention being thus described, it will be obvious that the same may be varied in many ways. The variations are not to be regarded as a departure from the spirit and scope of the invention, and all such modifications as would be obvious to one skilled in the art are intended to be included within the scope of the following claims.

We claim:

1. A shield for electronic components on a printed circuit board, comprising a housing for shielding said component, said housing comprising:
    at least one side wall surrounding said component,
    a plurality of spring contacts for engaging said board, and
    contact means for affixing said housing to said board, wherein said contact means comprises at least one of a clip and a rivet connection between said housing and said board.

2. The shield according to claim 1, wherein said shield is an EMC shield.

3. The shield according to claim 1, wherein said contact means comprises a screw connection between said housing and said board.

4. The shield according to claim 1, wherein said board further comprises solder deposited at a location where said shield housing is affixed to said board.

5. The shield according to claim 1, wherein said housing further comprises at least one projection and said board comprises at least one projection meting recess for accommodating said projection therein.

6. The shield according to claim 1, wherein said board further comprises a layer portion which provides electromagnetic radiation shielding to a component affixed to said board above or below said layer portion.

7. The shield according to claim 1 wherein said housing is a metal housing.

8. The shield according to claim 1, wherein said housing is a metalized plastic housing.

9. The shield according to claim 1, wherein said plurality of spring contacts are electrically conductive.

10. The shield according to claim 9, wherein said spring contacts are attached to said at least one side wall.

11. The shield according to claim 10, wherein said at least one side wall comprises a bottom facing which faces said board when said housing is affixed to said board, and wherein said contacts are attached along said bottom.

12. The shield according to claim 11, wherein said housing further comprises at least one lug with a recess for said screw to pass through.

13. The shield according to claim 11, wherein said board further comprises solder deposited at a location where said shield housing is affixed to said board, said solder facilitating electrical contact between said board and said plurality of spring contacts.

14. The shield according to claim 12, wherein said recess is a hole passing through said at least one lug.

15. The shield according to claim 14 wherein said lug is attached to said at least one side wall.

16. The shield according to claim 5, wherein said at least one side wall comprises at least two walls joined together so as to form the at least one side wall and said lug is attached at a corner formed by said joined side walls.

17. The shield according to claim 16, wherein said lug is located proximate to a bottom of said at least two joined side walls, said bottom facing said board when said housing is affixed to said board.

18. A housing for electromagnetic shielding of an electronic component affixed on a printed circuit board, comprising:
    at least two side walls joined to form a perimeter around said component,
    a cover attached to said at least two side walls and covering said component,
    a plurality of conductive spring contacts, and
    a holding element positioned on said side walls,
    and pressure contact means accommodated within said holding element, said contact means facilitating affixing of said housing to said board and said contact means comprising at least one of cup and a rivet connection.

19. The housing according to claim 18, wherein said pressure contact means comprises a screw connection.

20. The housing according to claim 19, wherein said holding element comprises a lug having a recess for accommodating said screw connection therethrough.

21. The housing according to claim 18, wherein said housing further comprises a projection and said board further comprises a projection receiving recess for accommodating said projection therein.

22. The housing according to claim 18, wherein said housing is a metal housing.

23. The housing according to claim 18, wherein said housing is a metalized plastic housing.

* * * * *